US009904027B2

(12) United States Patent
Faw et al.

(10) Patent No.: US 9,904,027 B2
(45) Date of Patent: Feb. 27, 2018

(54) RACK ASSEMBLY STRUCTURE

(71) Applicant: Intel Corporation, Santa Clara, CA (US)

(72) Inventors: Donald L. Faw, Hillsboro, OR (US); Uri V. Cummings, Saratoga, CA (US); Terrence J. Trausch, Portland, OR (US); Daniel P. Daly, Ann Arbor, MI (US); Andrew C. Alduino, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/378,786

(22) Filed: Dec. 14, 2016

(65) Prior Publication Data

US 2017/0102510 A1    Apr. 13, 2017

Related U.S. Application Data

(63) Continuation of application No. 14/236,583, filed as application No. PCT/US2014/011643 on Jan. 15, 2014, now Pat. No. 9,609,782.

(60) Provisional application No. 61/752,963, filed on Jan. 15, 2013, provisional application No. 61/752,966, filed on Jan. 15, 2013.

(51) Int. Cl.
| | |
|---|---|
| *G02B 6/00* | (2006.01) |
| *G02B 6/44* | (2006.01) |
| *H05K 7/14* | (2006.01) |
| *G02B 6/38* | (2006.01) |
| *H04Q 1/02* | (2006.01) |

(52) U.S. Cl.
CPC ......... *G02B 6/4452* (2013.01); *G02B 6/3897* (2013.01); *H04Q 1/09* (2013.01); *H04Q 1/13* (2013.01); *H05K 7/1492* (2013.01)

(58) Field of Classification Search
None
See application file for complete search history.

(56) References Cited

U.S. PATENT DOCUMENTS

| | | | |
|---|---|---|---|
| 8,902,593 B2 | 12/2014 | Hormuth et al. | |
| 8,982,552 B2 * | 3/2015 | Roesner | G06F 13/14 165/104.33 |

(Continued)

OTHER PUBLICATIONS

International Search Report and Written Opinion for PCT Application No. PCT/US2014/011643; dated May 2, 2014.

(Continued)

*Primary Examiner* — Rhonda Peace
(74) *Attorney, Agent, or Firm* — Schwabe, Williamson & Wyatt, P.C.

(57) ABSTRACT

Embodiments of the present disclosure provide techniques and configurations for a rack assembly. In one embodiment, a tray to be disposed in a rack assembly may comprise a plurality of sleds with individual sleds including one or more compute nodes; and a networking element coupled with a sled of the plurality of sleds and configured to communicatively connect the sled to one or more other components of the rack assembly via an optical communication system. The optical communication system may include an external optical cable configured to communicatively connect the networking element with the rack assembly. Other embodiments may be described and/or claimed.

18 Claims, 9 Drawing Sheets

(56) References Cited

U.S. PATENT DOCUMENTS

| | | | |
|---|---|---|---|
| 9,483,089 B2* | 11/2016 | Doglio | G06F 1/183 |
| 2005/0050272 A1* | 3/2005 | Behrens | G06F 1/18 |
| | | | 711/114 |
| 2009/0290312 A1 | 11/2009 | Bousseton et al. | |
| 2010/0024001 A1* | 1/2010 | Campbell | G06F 21/85 |
| | | | 726/2 |
| 2010/0296791 A1* | 11/2010 | Makrides-Saravanos | |
| | | | G02B 6/4455 |
| | | | 385/135 |
| 2011/0051341 A1* | 3/2011 | Baldassano | G02B 6/4452 |
| | | | 361/679.02 |
| 2011/0164880 A1 | 7/2011 | Davidson et al. | |
| 2011/0243134 A1* | 10/2011 | Armstrong | H04L 45/66 |
| | | | 370/392 |
| 2011/0268441 A1 | 11/2011 | Goldstein et al. | |
| 2012/0110086 A1* | 5/2012 | Baitinger | G06F 9/5077 |
| | | | 709/205 |
| 2012/0134678 A1 | 5/2012 | Rosener et al. | |
| 2012/0087592 A1 | 6/2012 | Kim et al. | |
| 2012/0198253 A1* | 8/2012 | Kato | G06F 1/20 |
| | | | 713/320 |
| 2013/0155599 A1 | 6/2013 | Ross et al. | |
| 2013/0271904 A1 | 10/2013 | Hormuth et al. | |
| 2014/0108692 A1* | 4/2014 | Doglio | H05K 7/1489 |
| | | | 710/300 |
| 2015/0334867 A1 | 11/2015 | Faw et al. | |
| 2017/0102510 A1* | 4/2017 | Faw | G02B 6/4452 |

OTHER PUBLICATIONS

International Preliminary Report on Patentability for International Application No. PCT/US2014/011643; dated Jul. 30, 2015, 9 pages.

Office Action and Search Report dated May 5, 2016 for Taiwan Application No. 103101431, 14 pages.

Non-Final Office Action dated Jun. 14, 2016 for U.S. Appl. No. 14/236,583, 19 pages.

Notice of Allowance dated Sep. 12, 2016 for U.S. Appl. No. 14/236,583, 8 pages.

Corrected Notice of Allowance dated Oct. 12, 2016 for U.S. Appl. No. 14/236,583, 9 pages.

* cited by examiner

RACK ASSEMBLY STRUCTURE

CROSS-REFERENCE TO RELATED APPLICATIONS

The present application is a continuation of U.S. application Ser. No. 14/236,583, which is a national phase entry under 35 U.S.C. § 371 of International Application No. PCT/US2014/011643, filed Jan. 15, 2014, entitled "A RACK ASSEMBLY STRUCTURE", which designated, among the various States, the United States of America, and also claims priority to U.S. Provisional Applications 61/752, 963 and 61/752,966, filed on Jan. 15, 2013. The Specification of the PCT/US2014/011643 and U.S. patent application Ser. No. 14/236,583 Applications are hereby incorporated by this reference.

FIELD

Embodiments of the present disclosure generally relate to data center architecture, and more particularly, to using disaggregated rack structure in compute environment including data centers.

BACKGROUND

A computing data center may include one or more computing systems including a plurality of compute nodes that may comprise various compute structures (e.g., servers) and may be physically located on multiple racks. The servers and/or nodes comprising the servers may be interconnected, typically via one or more switches, forming different compute structures.

However, currently used data center structures that employ multiple racks may require substantial operation costs, energy consumption, complex management, and substantial maintenance, due to difficulties associated with accessing, servicing, and interconnecting different network and compute components (e.g., nodes) residing on the racks.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
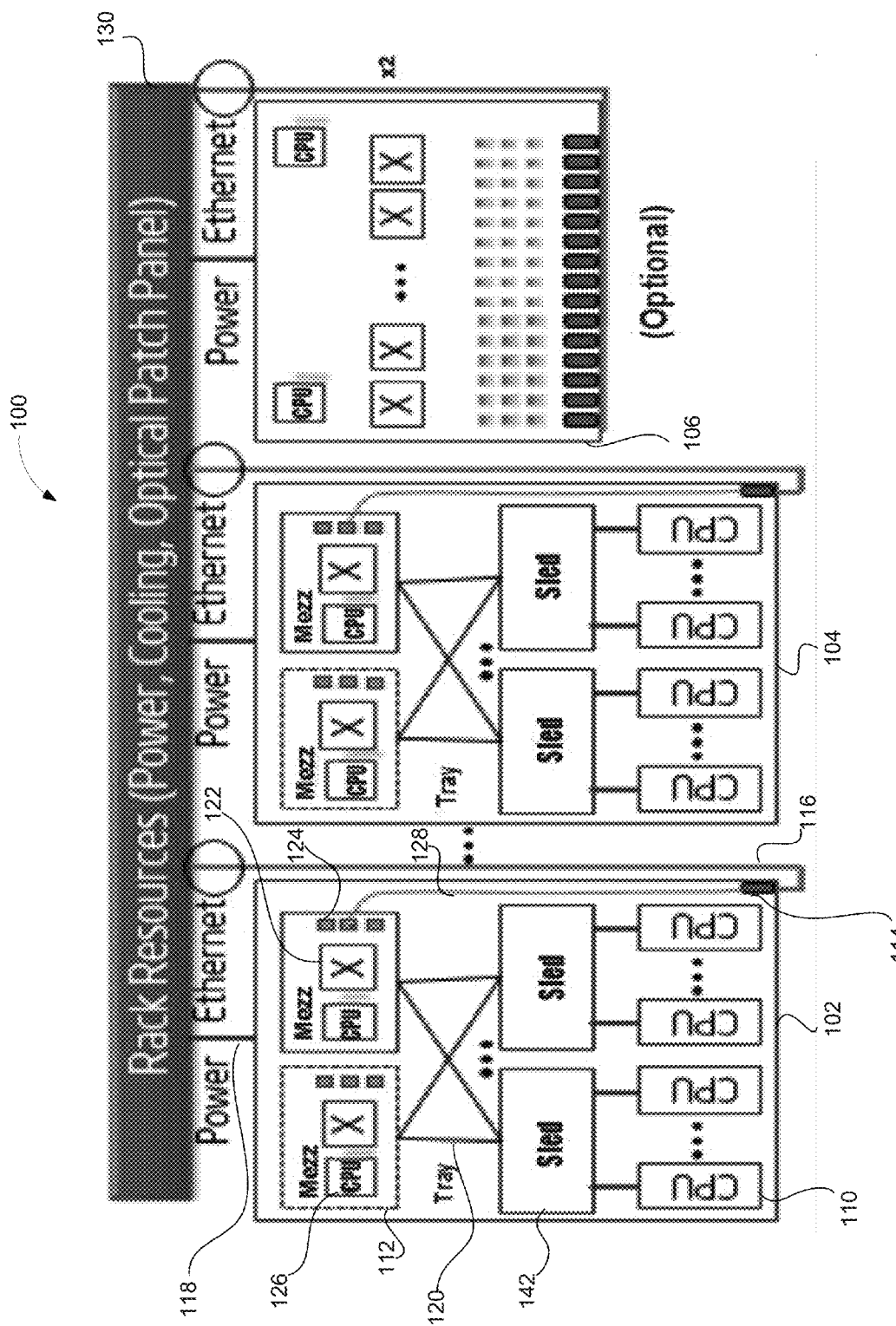
FIG. 1 schematically illustrates an example rack assembly that may be used in a data center architecture, in accordance with some embodiments.

Embodiments of the present disclosure include configurations for compute environment such as a data center or a server farm. The configurations may include one or more racks containing compute nodes, storage, and networking components that may be disposed within the racks in a disaggregated fashion.

In the following detailed description, reference is made to the accompanying drawings which form a part hereof, wherein like numerals designate like parts throughout, and in which are shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

FIG. 1 schematically illustrates an example rack assembly 100 that may be used in a compute environment, such as a data center or a system of servers, in accordance with some embodiments. In some embodiments, multiple rack assemblies may be included in a compute environment. The rack assembly 100 may include one or more (e.g., a set of) trays, for example, trays 102 and 104, in the rack assembly 100. Tray 102 may be communicatively connected within the rack assembly 100 by a power connector 118 providing power to the tray 102. The tray 102 may include a plurality of sleds such as a sled 142, with each sled having one or more compute nodes 110. The compute nodes 110 may provide a compute, storage, networking function, or a combination thereof, for the data center having the rack assembly 100. The compute node 110 may include at least one central processing unit (CPU), a memory and/or other components as needed or a combination thereof. The compute node structure is described in reference to FIG. 9. In general, the sled 142 may contain different types of compute, even over successive generations, providing for flexible compute.

While not explicitly described, the tray 104 may include communicative connections and components similar to tray 102. In some embodiments, trays 102 and 104 may include at least some dissimilar communicative connections/components.

The compute nodes 110 included in the sled 142 in the tray 102 may be communicatively connected with one or more other components of the rack assembly 100 and other rack assemblies comprising a compute environment (e.g., a data center) by an optical communication system configured to carry incoming and outgoing network (e.g., Ethernet) traffic. The communications between the compute nodes 110 included in the sled 142 on the tray 102 and other components of the compute environment (e.g., data center including the rack assembly 100) may be managed by one or more networking elements 112 disposed in the tray 102. The optical communication system providing the communication links between the tray 102 and the other components of the rack assembly 100 will be described below in detail. The sled 142 may be communicatively connected to the networking element 112 via communicative connections 120.

In some embodiments, the networking element 112 may include or be included in (e.g., reside on) a mezzanine card. In some embodiments, a mezzanine card may comprise a small board where electrical signals, such as Peripheral Component Interconnect Express (PCIe) or Ethernet signals, may be aggregated prior to transmission via an optical module (e.g., optical module 124 described below). The networking element 112 may include a switch 122 (e.g., a switch chip) and a control unit 126 (e.g., CPU control module) configured to manage communicative connections provided by the switch 122. An embodiment in which the networking element 112 includes or is included in a mezzanine card is described in greater detail in reference to FIG. 4.

The optical communication system configured to connect the sled 142 with other components of the rack assembly 100 may include one or more optical modules 124 residing on the networking element 112 and an optical jumper cable 128 communicatively coupling the optical modules 124 with an optical connector 114. The optical module 124 may comprise an optical transceiver capable of both transmitting and receiving optical data streams. The optical connector 114 may be configured to communicatively couple the optical modules 124, via the jumper cable 128, with an external optical cable 116. The external optical cable 116 may provide a communicative connection of the tray 102 to other components of the rack assembly 100 and to other rack assemblies (not shown) via a rack resource component 130. The rack resource component 130 may include, for example, a patch panel.

As described above, the networking element 112 may be disposed separately from the compute nodes 110 residing on the sled 142, such as may reside on a mezzanine card, while the compute nodes (e.g., CPUs) may reside on the sled 142 that may be configured to be physically removable via front access to the rack assembly 100. In other words, the sled 142 within the tray 102 (104) may allow for compute nodes to be removed and replaced without changing the network elements 112, due to the communicative connections provided by the optical communication system comprising parallel optics. The optical communication system is described in greater detail in reference to FIG. 5.

The networking element 112 disposed on the tray 102 to provide communicative connections for the tray 102 (104) via the optical communication system, may be integrated (e.g., on a mezzanine card) or may be distributed throughout the rack assembly 100. This distribution may allow the networking elements 112 within the rack assembly 100 to be managed and controlled as a single network entity. Using the connectivity provided by the optical communication system, the compute nodes 110 of the sled 142 may be interconnected using a passive connectivity element, for example a passive patch panel (described in greater detail in reference to FIGS. 2 and 6), thus removing the need for a discrete networking element in the rack assembly 100. A discrete networking element (e.g., a switch shown in FIG. 1 as optional tray 106) may be used to increase the networking bandwidth between compute nodes (as described in detail in reference to FIG. 7), but may not be required. In summary, the rack assembly 100 disaggregated as described above may provide network flexibility, matching the network with application workload demands, and may be updated over time separately from the compute nodes 110 comprising the rack assembly 100.

Figure 2:
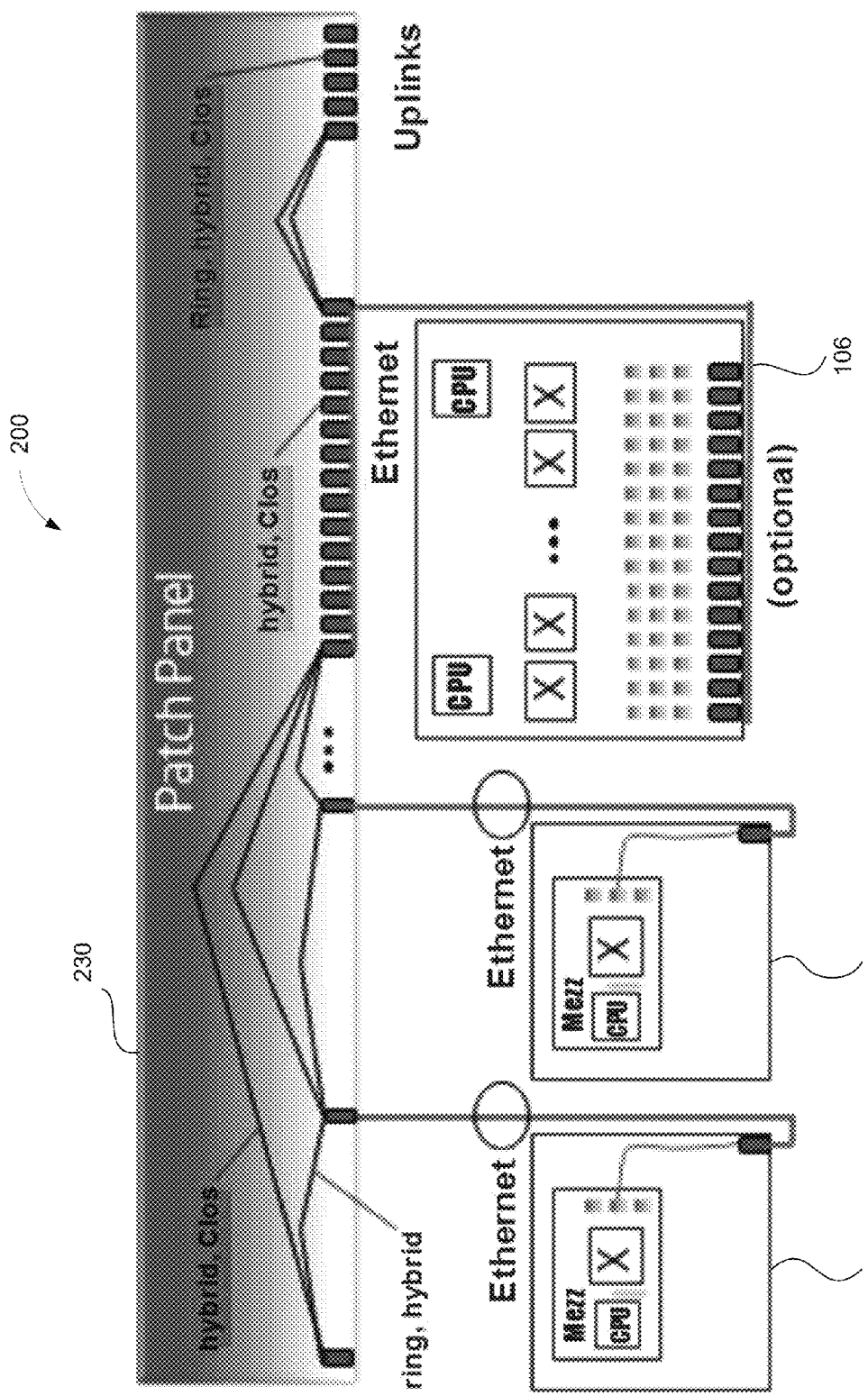
FIG. 2 schematically illustrates an example network connectivity model for the rack assembly described in reference to FIG. 1.

FIG. 2 is a block diagram illustrating an example network connectivity model 200 for the rack assembly 100 of FIG. 1, in accordance with some embodiments. In some embodiments, the connectivity model 200 may be implemented within a physical patch panel, such as a patch panel 230. In some embodiments, the patch panel 230 may comprise a passive patch panel. As shown, the trays 102, 104, and 106 may be communicatively connected to components of the rack assembly 100 via the patch panel 230 using different connection topologies that may provide a varying degree of bandwidth between compute nodes 110 within the rack assembly 100. By using the connectivity within the patch panel 230, each compute node 110 in the tray 102 may be interconnected to all other compute nodes, for example, compute nodes of tray 104, as well as to other rack assemblies that may constitute a data center, without adding a discrete networking element (such as tray 106) into the rack assembly 100. The topologies in different implementations may include an N-dimensional (N-D) ring, Clos (a multi-stage circuit switching network representing an idealization of multi-stage telephone switching systems), or a combination thereof (e.g., a hybrid topology), as indicated in FIG. 2. A varying number of links within the parallel optics comprising an optical communication system may be used to build the intra-rack and inter-rack connectivity.

In general, any computer network may be represented as a graph of vertices (switches) and edges (links). The switch integrated into the tray with the parallel optics may enable at least some (e.g., majority) of the networking function to be distributed, with the switching being performed first in 112 and then further and optionally in a second set of switches. For example, there may be switches disposed above the patch panel in 106. The benefit of such structure is in reducing the cost associated with the second level of switches, while maintaining one optical cable per tray. Any topology may be feasible in this architecture, including circulant graph, paylay graph, or Clos.

Figure 3:
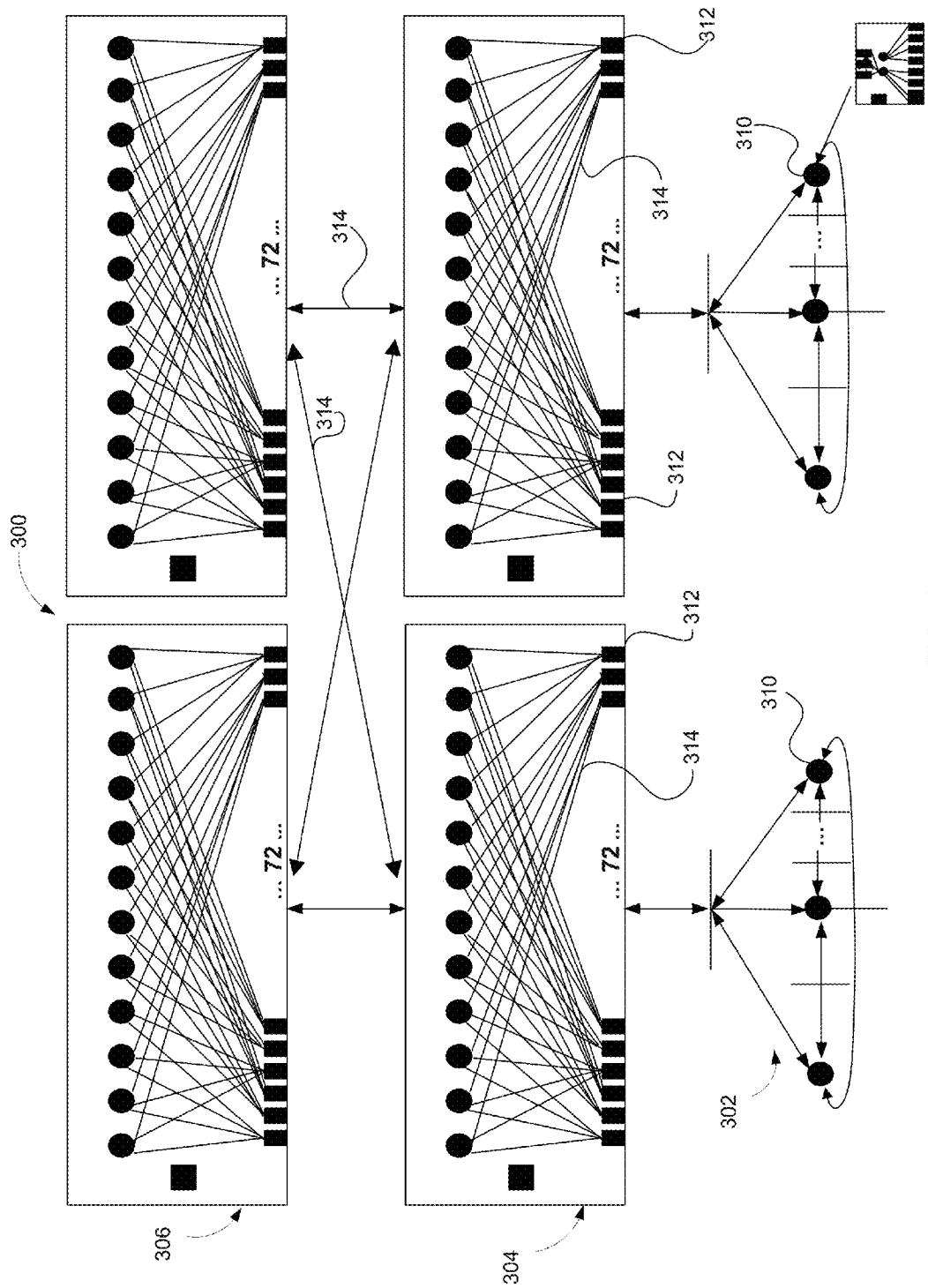
FIG. 3 is a block diagram illustrating one example network connectivity model for the rack assembly, implementing a 3-stage Clos-ring hybrid scheme, in accordance with some embodiments.

FIG. 3 is a block diagram 300 illustrating one example network connectivity model for the rack assembly 100, implementing a 3-stage Clos-ring hybrid scheme, in accordance with some embodiments. The diagram 300 includes a ring 302 and the 2-stage Clos models 304 and 306 built on top of the ring 302. The scheme's elements include multiple switches 310 (similar to the switch 122) and optical modules 312 (similar to the optical module 124), connected via optical communication links 314. In a 2-stage Clos model, a butterfly pattern of connectivity between the leaf nodes (first stage) and the spine nodes (second stage) may be used. For example, for a 4-port switch (122), in order to have a Clos model six switches may be used, namely four leaves and two spines, and each leaf may be connected to each spine. Half of the ports from the leaf go down into the network. This structure may result in an 8-port total switch, thus doubling the port count.

To build a 3-stage Clos model, at least 8 ports in the switch 310 may be used, having two rows of leaf switch (4 ports down, 4 ports up) and the third row may comprise spines at the top. Accordingly, there may be 8 first stage leaves, 8 second stage leaves, and 4 spines, which may result in a 128 port switch.

For radix R, a 2-stage Clos model may provide a maximum of $R\hat{0}2/2$ ports. A 3-stage Clos model may provide a maximum of $R\hat{0}3/4$ ports. More generally, an n-stage Clos may provide $R\hat{0}n/(2(n-1))$ ports. Clos model may be used to get to a high port count overall, wherein chips consumed may be calculated as $(2n-1)/2(n-1)*R\hat{0}2$. Thus, a Clos model may consume a quadratic number of chips in the number of stages. It may be desirable to reach as high radix as possible in the number of stages. By implementing the bottom stage as a load balancing ring, the overall port count or scale of a Clos model may be increased, whether the model comprises two or three stages. In general, designs may be implemented that reduce the number of stages, or make one of the stages based on a higher radix effective switch.

Figure 4:
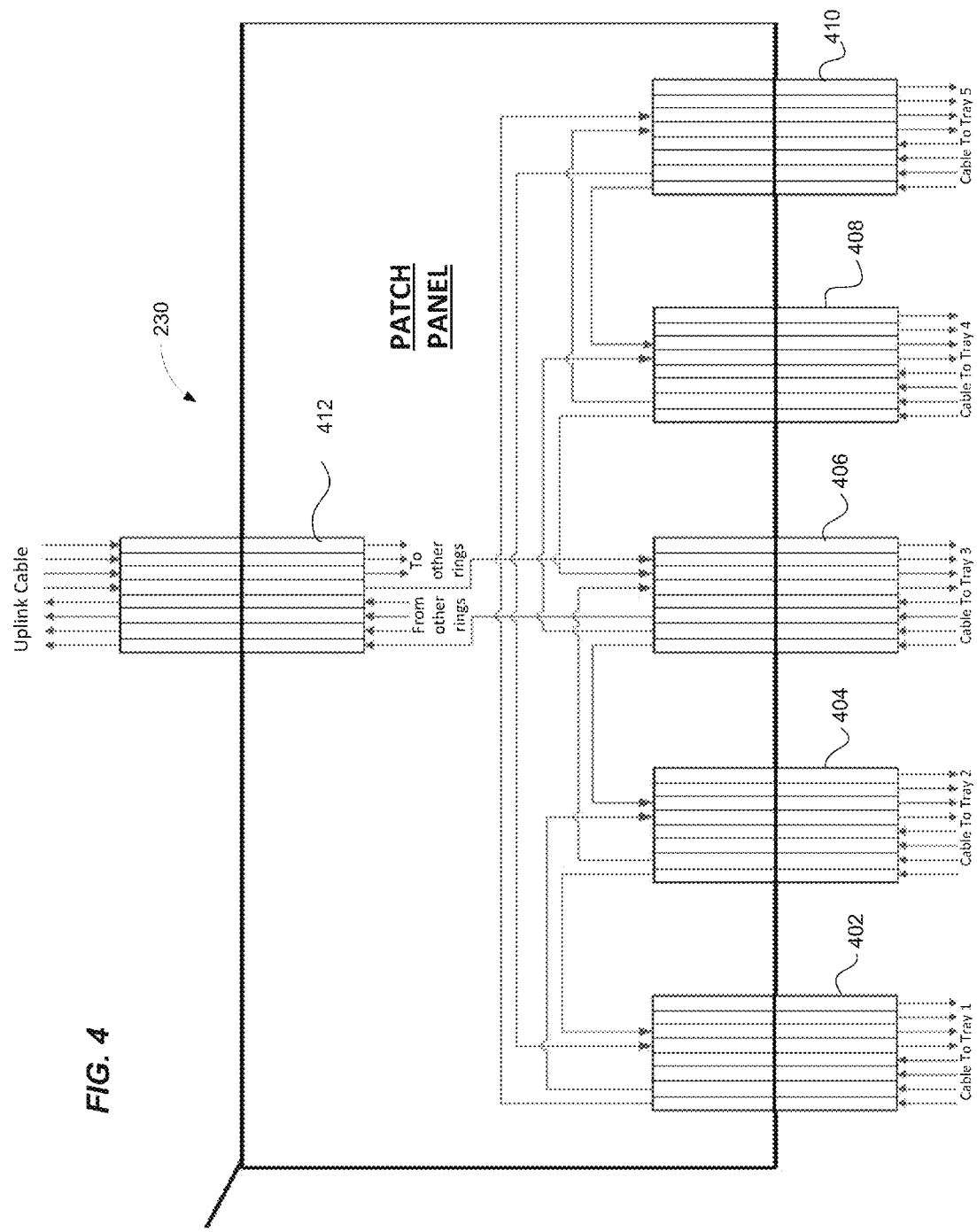
FIG. 4 schematically illustrates an example optical patch panel implementation, in accordance with some embodiments.

FIG. 4 illustrates an example optical patch panel 230 implementation, in accordance with some embodiments. The optical patch panel 230 comprises a passive optical connection, connecting the optical channels from the compute nodes and other elements, such as input-output (I/O) subsystems and/or switches via uplinks, forming fabric topology within the rack assembly 100 and/or between rack assemblies. The optical patch panel 230 includes multiple optical cables 402, 406, 406, 408, 410, etc. comprising external optical cables 116, providing communicative connections between the trays (e.g., trays 1, 2, 3, 4, 5, N) included in a rack assembly as described in reference to FIG. 1. The optical patch panel 230 further includes uplink cable 412 providing a communicative connection with other rack assemblies. The optical patch panel 230 comprises a ring model and allows for an external connection between the patch panel 230 and the subsystems included in the rack assembly 100 and a compute environment comprising the rack assembly 100. It should be appreciated that multiple fabric connectivity topologies may be implemented; the illustrated implementation is not limited to the ring example shown in FIG. 4. Such topologies may include, but may not be limited to, two-dimensional (2D) and three-dimensional (3D) Torus, and other mesh type configurations.

Figure 5:
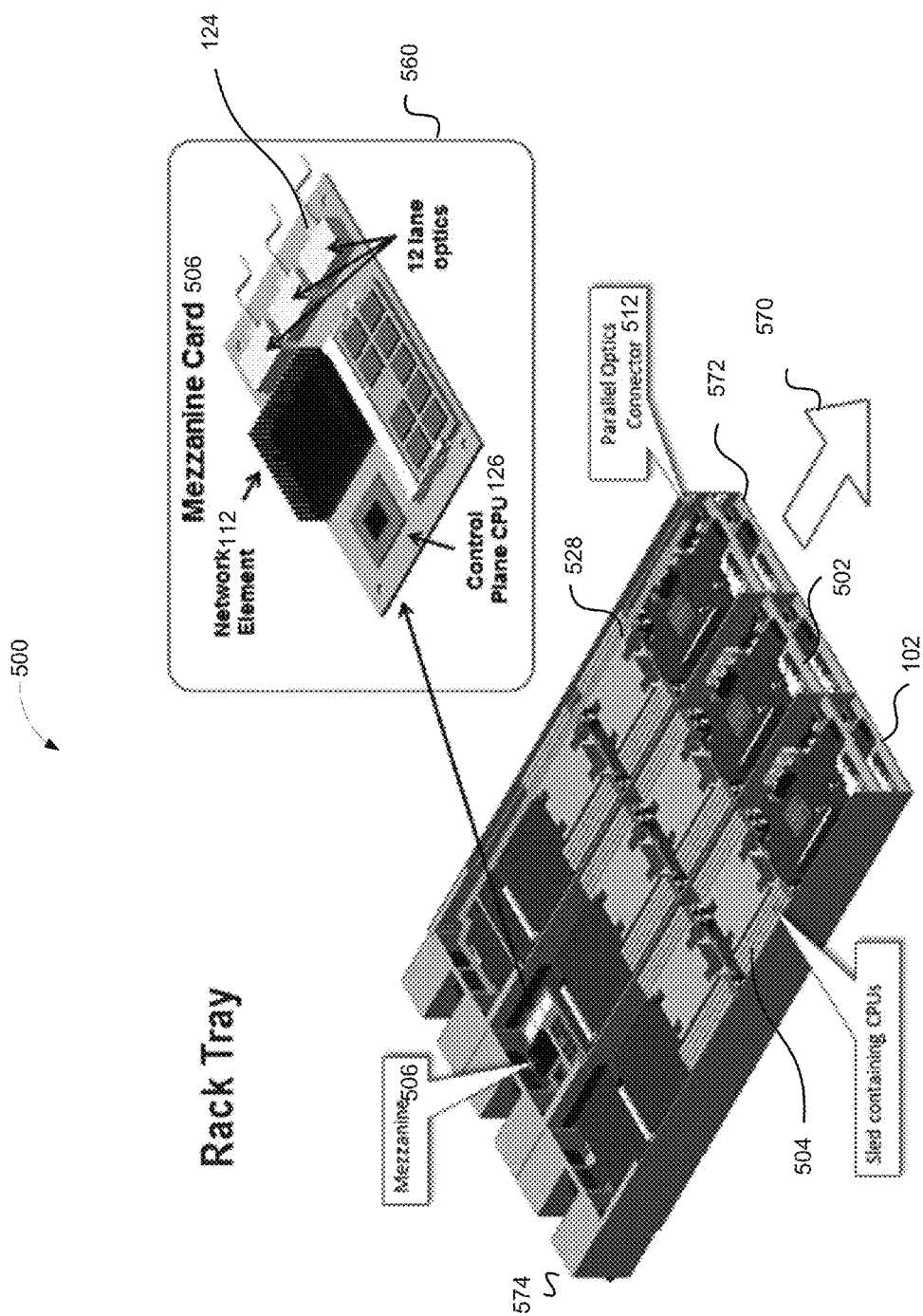
FIG. 5 illustrates a perspective view of a tray that may be included in a rack assembly, in accordance with some embodiments.

FIG. 5 illustrates a perspective view of the tray 102 in accordance with some embodiments. It should be understood that the tray 102 may comprise a sub-rack level of aggregation and distribution for the rack assembly 100. The tray 102 may include a midplane board 502 into which planar circuit boards 504 (e.g., sleds such as sled 142) may be plugged through co-planar or perpendicular connectors (not shown). A mezzanine card (e.g., mezzanine card 506, which may include or be included in the networking element 112) may plug into the midplane board 502, e.g., through a riser connector (not shown). An enlarged view 560 of the mezzanine card 506 is shown in FIG. 5.

The planar circuit boards 504 may also be configured to serve as a base for vertical cartridges. A parallel optical connector 512 (similar to 114) may be a part of the tray 102 housing, and not attached directly to any of the coplanar, vertical, or mezzanine cards or boards. The optical connector 512 is described in greater detail in reference to FIG. 6. An optical fiber segment 528 (similar to the optical jumper 128) may connect the optical connector 512 to the mezzanine card 506. Other signals, such as power signal, may connect (not shown) through the tray midplane board 502.

A rack assembly, such as the rack assembly 100, may be configured with bussed power available to all trays (e.g., 102) in the rack assembly 100, a patch panel (e.g., passive patch panel 230), and cabling between the patch panel 230 and each tray 102. This configuration allows for upgrade of the tray 102 independently from the rack assembly 100.

As described in reference to FIG. 5, the tray 102 inserting into the rack assembly 100 may include a midplane board 502 to interconnect power, networking, storage, management, and server/compute. Each of these elements may be independent of the other. The networking subsystem may include the networking circuitry and cabling in a co-planar mezzanine module (e.g., mezzanine card 506) that may be pluggable into the tray 102. The networking subsystem may be upgraded by removing the cable connections to the mezzanine card 506 and replacing the mezzanine card 506.

Because the server/compute subsystem may be independent of the networking subsystem, the server/compute subsystem may be upgradable independently of the networking subsystem. As indicate by arrow 570, the tray 102 may be removable at its front end 572, and may attach to the rack assembly at its back end 574.

Figure 6:
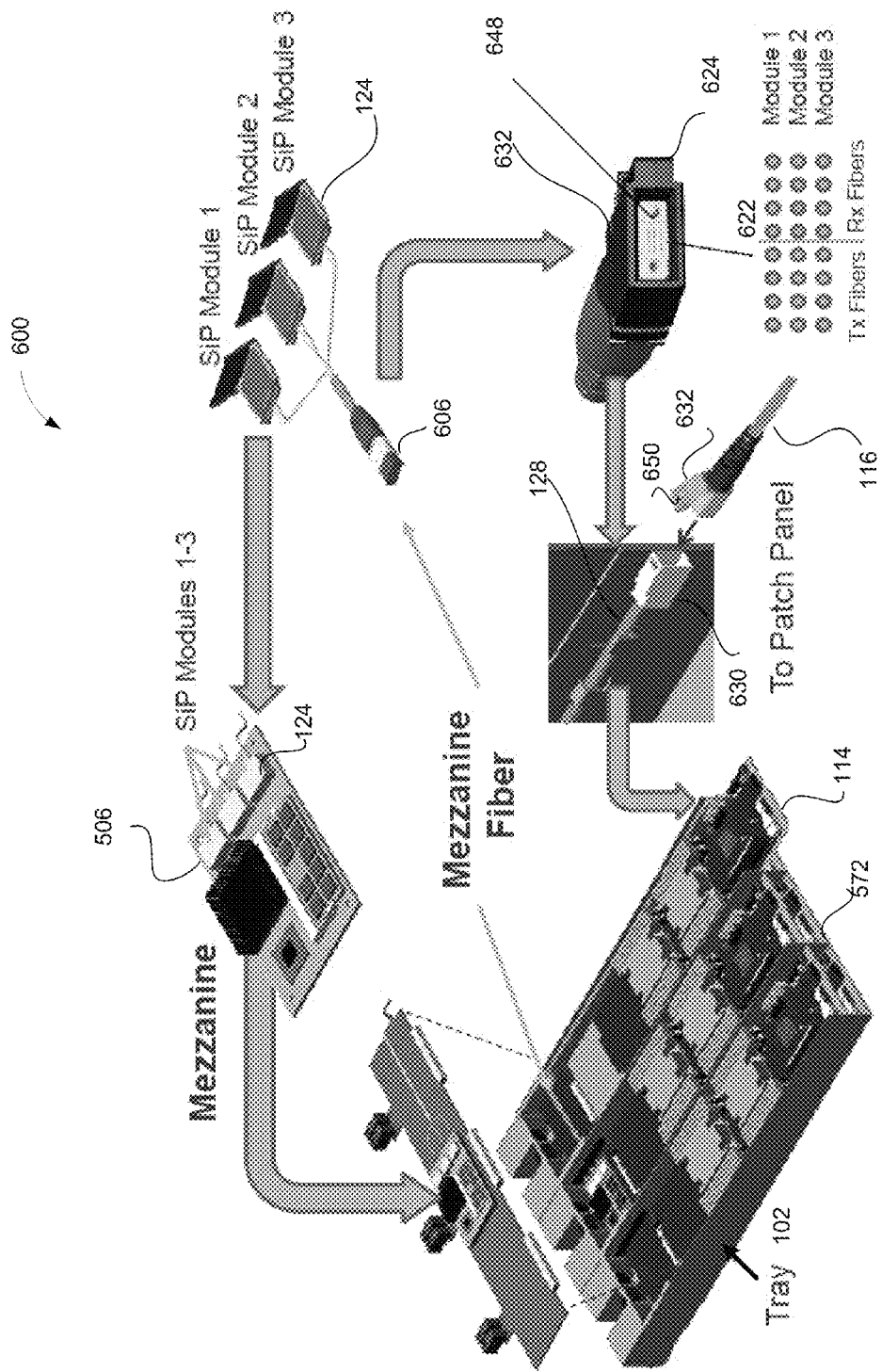
FIG. 6 illustrates a perspective view of a tray that may be included in a rack assembly, with an optical communication system configured to provide communicative connection for the rack assembly, some elements of which are shown in greater detail, in accordance with some embodiments.

FIG. 6 illustrates a perspective view the tray 102 with some connectivity elements shown in greater detail in accordance with some embodiments.

As described in reference to FIG. 1, the optical communication system may include the components 124, 128, 114, and 116, some of which are described herein in greater detail. As discussed above, some of the optical communication system components may reside on the mezzanine card 506. For example, optical modules 124 may comprise silicon photonic (SiP) modules with a number (e.g., N) of fiber connections interfacing to a mezzanine multi-fiber cable, such as the optical jumper cable 128, via an optical connector 606. The mezzanine multi-fiber cable such as the optical jumper cable 128 may provide for the optics to be embedded in the system while still allowing an optical connection in the front or rear of the rack chassis with a single multi-fiber bulkhead connection. This may allow the compute or input-output trays (e.g., tray 102) to be accessible from the front for easy removal.

The optical jumper cable 128 may communicatively connect with the external optical cable 116 via the optical connector 114. The optical connector 114 may include a connector receptacle 630 that may be attached around the front end 572 of the tray 102. The receptacle 630 may provide a reference for a photonic connector mated pair formed by the receptacle 630 from the internal fiber jumper and a photonic connector plug 632 of the external optical cable 116. The optical connector 114 may be configured to support up to 4 rows of 16 fibers each for a total scalable solution of 64 optical fibers, which may result in a fiber density of greater than one fiber per square millimeter. As shown, the photonic connector plug 632 may include a fiber ferrule 622 and a ferrule housing 624. The mechanical alignment tolerance may be provided by the mechanical alignment pins 648 and the latching mechanism 650.

FIG. 6 shows an implementation of the photonic connector plug 632 with 24 fibers arranged in 3 rows of 8 each, represented by the lenses in the fiber ferrule 622 portion of the design. This particular implementation is shown for illustrative purposes only; other implementations according to the described design may be accomplished. As described above, the external optical cable 116 coupled with the photonic connector plug 632 may make the optical connection between the server/compute subsystem and the patch panel (e.g., 230) or discrete networking element (e.g., 106) such as a Top-of-Rack (TOR) switch. The external optical cable configured with the connector plug 632 may provide a 1:1 optical connection of each optical channel to the patch panel 230.

Figure 7:
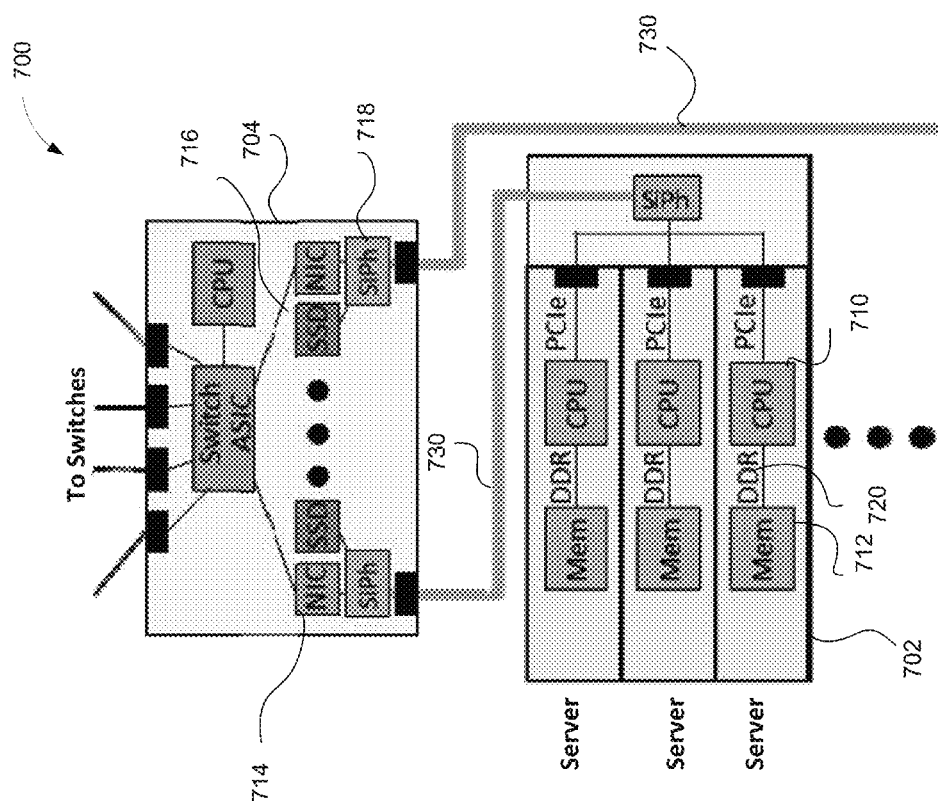
FIG. 7 is a block diagram illustrating an example disaggregated compute system that may be employed in a data center, in accordance with some embodiments.

FIG. 7 is a block diagram illustrating an example disaggregated compute system 700 that may be employed in a data center, in accordance with some embodiments. The example system 700 may include one or more components of the rack assembly 100 discussed in FIGS. 1-6.

The example system 700 includes one or more trays 702 (similar to 102) that may contain one or more CPUs 710 and the associated memory 712 coupled via an interface 720 such as double data rate (DDR) synchronous dynamic random-access memory interface (SDRAM), and control and boot support (not shown). In some embodiments, the compute nodes comprising the tray 702 may form a server.

Communications may be aggregated between the trays 702 through a silicon photonics module 718 (similar to optical module 124) to a switch, such as a Top of Rack (ToR) switch 704, which may be configured to provide communications interconnections for the compute nodes and other devices. The ToR switch 704 may communicate to the individual compute nodes in the trays 702 elements through a Network Interface Chip (NIC) 714 via an optical cable 730, and also support an array of Solid State Disk Drives (SSDs) 716. This configuration may allow for the modular upgrade of the computing and memory infrastructure. It should be appreciated that other configurations for the disaggregated compute system architecture are possible, for example, including the disaggregation of the memory system.

Figure 8:
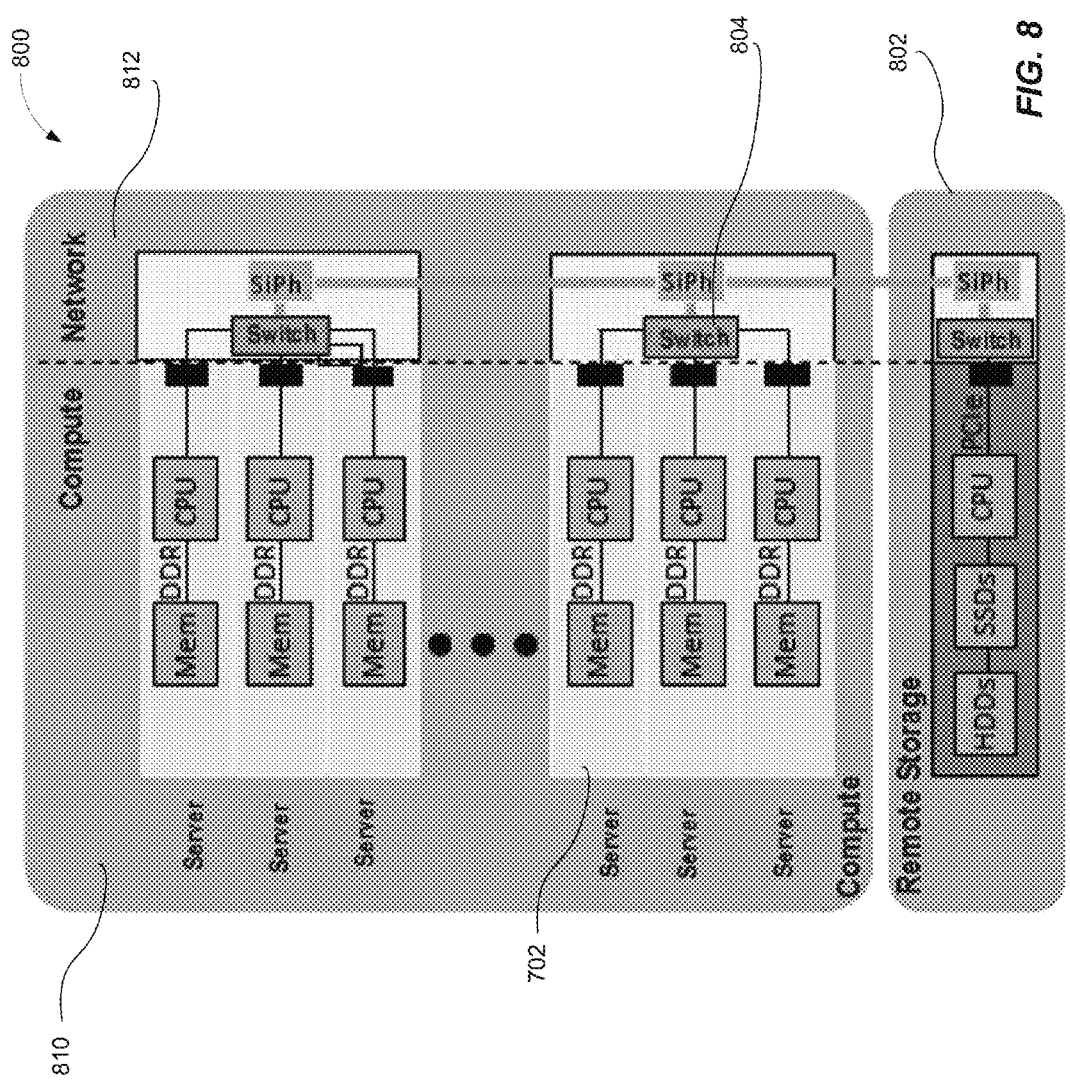
FIG. 8 is a block diagram illustrating another example disaggregated compute system 800 that may be employed in a data center, in accordance with some embodiments.

FIG. 8 is a block diagram illustrating another example disaggregated compute system 800 that may be employed in a data center, in accordance with some embodiments. As shown, the system 800 may include one or more trays 702 discussed in reference to FIG. 7, as well as a remote storage 802. As shown, the compute and network functions may be distributed between the system components, as indicated by numerals 810 and 812 respectively. A switch 802 (e.g., integrated in a switch chip) may be configured to support aggregation of data streams between the trays 702 to reduce overall fiber and cabling burden as well as a distributed switching functionality. This approach may allow for a granular deployment of resources throughout the data center infrastructure, and may support a granular approach to upgradability and re-partitioning of the architecture in such a way that system resources may be shared between different compute elements. It should be understood that the components 810 and 812 in this example system 800 may be swapped dynamically and asymmetrically so that improvements in bandwidth between particular compute nodes of trays 702 may be upgraded individually.

Figure 9:
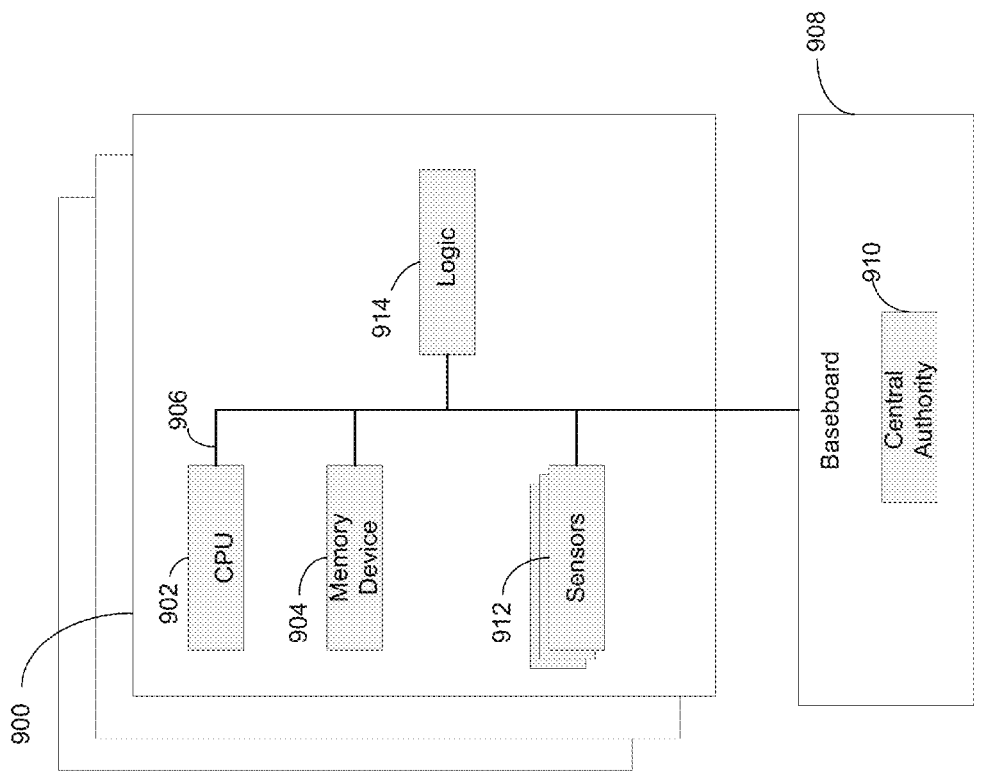
FIG. 9 is a block diagram of a compute module comprising a compute node that may be similar to compute nodes used in the rack assembly of FIG. 1.

FIG. 9 is a block diagram of a compute module comprising a compute node 900 that may be similar to compute nodes used in the rack assembly 100 of FIG. 1. (Hereinafter, the terms compute node and compute module will be used interchangeably.) The compute node 900 may be used, for example, to form various compute structures (e.g., servers) for a data center, in accordance with embodiments described in reference to FIGS. 1-9. The compute module 900 may comprise, for example, a laptop computer, desktop computer, tablet computer, mobile device, server, or blade server, netbook, a notebook, an ultrabook, a smartphone, a personal digital assistant (PDA), an ultra mobile PC, a printer, a scanner, a monitor, a set-top box, an entertainment control unit, a digital camera, a portable music player, or a digital video recorder, among others. In further implementations, the compute module 900 may be any other electronic device that processes data.

In some examples, a compute module or compute node is any device that is capable of communicating across the multi-node system to another module. Accordingly, in some examples, the multi-node system is a network of modules, where each module is any device capable of communicating across the network. Additionally, in some examples, the multi-node is a server in a rack server system. The compute module 900 may include a central authority coupled to a plurality of nodes and containing management firmware for the plurality of nodes in a data center or server farm.

The compute module 900 may include a host central processing unit (CPU) 902 that is configured to execute stored instructions, as well as a memory device 904 that stores instructions that are executable by the host CPU 902. The host CPU 902 may be coupled to the memory device 904 by a bus 906. Additionally, the host CPU 902 may be a single core processor, a multi-core processor, a computing cluster, or any number of other configurations. In some cases, the host CPU 902 and other components of the compute module 900 may be implemented as a system on chip (SOC). Furthermore, the compute module 900 may include more than one host CPU 902. The memory device 904 may include random access memory (RAM), read only memory (ROM), flash memory, or any other suitable memory systems. For example, the memory device 904 may include dynamic random access memory (DRAM).

The compute module may be communicatively connected to a baseboard 908. The baseboard 908 may contain a central authority 910. The central authority is used to manage each node connected to the baseboard. Additionally, each compute module may also include a plurality of sensors 912. The sensors may collect data regarding its respective node. For example, sensors may collect system management information for each node. The data may include power management data, humidity control data, cooling control data, workload provisioning data, storage servicing data, I/O data, throughput data and the like. The system management data is transmitted to a central authority.

Each compute module also includes logic 914. The logic 914 enables monitoring of system management data for each node. System management data may be passed to the central authority 910 through the logic 914. In some cases, system management data is gathered through several different interfaces. For example, a general purpose input\output (GPIO) interface may be used to enable access to power control, reset, and status information of the compute module 900 from the host CPU 902. A low pin count (LPC) or enhanced serial peripheral interface (eSPI) bus may be used to support various embedded controllers of the compute module 900. Additionally, a platform environment control interface (PECI) may be used to manage thermal sensors within the compute module 900. The logic 914 may obtain system management information from various interfaces and transmit this data to the central authority. Similarly, the central authority may manage the compute module 900 by transmitting information to the logic 914. The logic 914 may transmit the necessary information to the host CPU 902. In this manner, a standardized set of interfaces may be used to communicate with the host CPU 902.

The block diagram of FIG. 9 is not intended to indicate that the compute module 900 is to include all of the components shown in FIG. 9. Further, the compute module 900 may include any number of additional components not shown in FIG. 9, depending on the details of the specific implementation. Moreover, the compute module 900 may include fewer components than those illustrated in FIG. 9. For example, the compute module 900 may include a GPU, I/O device interface, or display interface.

The embodiments described herein may be further illustrated by the following examples. Example 1 is tray to be disposed in a rack assembly, the tray comprising: a plurality of sleds with individual sleds including one or more compute nodes; and a networking element coupled with a sled of the plurality of sleds and configured to communicatively connect the sled to one or more other components of the rack assembly via an optical communication system, wherein the optical communication system includes an external optical cable configured to communicatively connect the networking element with the rack assembly.

Example 2 may include the subject matter of Example 1, and further specifies that the networking element includes a switch component configured to communicatively connect the sleds to the optical communication system.

Example 3 may include the subject matter of Example 2, and further specifies that the networking element includes a control unit configured to manage communicative connections provided by the switch component.

Example 4 describes a rack assembly comprising the tray of claim 2 and the optical communication system, wherein the optical communication system further includes an optical module configured to communicatively connect the networking element with the rack assembly via the switch component to transmit and receive optical data streams.

Example 5 may include the subject matter of Example 4, and further specifies that the optical module is configured to communicatively connect with the external optical cable via an optical jumper cable.

Example 6 may include the subject matter of Example 5, and further specifies that the rack assembly further comprises a patch panel, wherein the at least one external optical cable is configured to communicatively connect the networking element with the patch panel of the rack assembly.

Example 7 may include the subject matter of Example 6, and further specifies that the patch panel is a passive patch model configured to provide communicative connections within the rack assembly or between the rack assembly and another rack assembly, the communicative connections forming a connectivity model.

Example 8 may include the subject matter of Example 7, and further specifies that the connectivity model includes an n-dimensional (N-D) ring topology, Clos topology, or a combination thereof.

Example 9 may include the subject matter of Example 6, and further specifies that the tray comprises a front end and a back end, wherein the tray is disposed in the rack assembly with the back end facing a frame of the rack assembly.

Example 10 may include the subject matter of Example 9, and further specifies that the external optical cable is communicatively connected with the optical jumper cable with a parallel optics connector disposed at the front end of the rack assembly.

Example 11 may include the subject matter of Example 9, and further specifies that the networking element comprises a mezzanine card disposed in the back end of the tray.

Example 12 may include the subject matter of any of Examples 4 to 11, and further specifies that the sled is configured to be removable from the tray without removing the tray from the rack assembly.

Example 13 may include the subject matter of any of Examples 4 to 11, and further specifies that the compute node comprises a central processing unit.

Example 14 may include the subject matter of any of Examples 4 to 11, and further specifies that the compute node comprises a memory.

Example 15 is a method for forming a rack assembly, comprising: forming a tray including: a plurality of sleds, with individual sleds including one or more compute nodes; and
a networking element coupled with a sled of the plurality of sleds and configured to communicatively connect the sled to one or more components of the rack assembly via an optical communication system; and communicatively connecting the tray to the rack assembly with the optical communication system, wherein the optical communication system includes an external optical cable configured to communicatively connect the networking element with the rack assembly.

Example 16 may include the subject matter of Example 15, and further specifies that forming a tray further includes assembling the networking element, including adding a switch component configured to communicatively connect the sleds to the optical communication system, and coupling the switch component with a network interface component configured to provide network connection for the tray.

Example 17 may include the subject matter of Example 15, and further specifies that forming a tray further includes: assembling the optical communication system, including providing an optical module configured to communicatively connect the networking element with the one or more components of the rack assembly via the switch component to transmit and receive optical data streams; and communicatively connecting the optical module to an external optical cable via an optical jumper cable, the external optical cable configured to communicatively connect the networking element with a patch panel of the rack assembly.

Example 18 may include the subject matter of Example 17, and further specifies that forming a tray further includes: disposing a parallel optics connector about a front end of the tray; and communicatively connecting the optical jumper with the external optical cable via the parallel optics connector.

Example 19 may include the subject matter of Example 18 and further specifies that the method further comprises disposing the tray on the rack assembly, with a back end of the tray facing a frame of the rack assembly and the front end of the tray facing outward.

Example 20 may include the subject matter of any of Examples 15 to 19, and further specifies that the compute node comprises a central processing unit and/or a memory.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A rack assembly, comprising:
    a tray, having at least one sled including at least one compute node, and a midplane coupled with the sled, to provide connectivity for the sled;
    an optical patch panel coupled with the midplane via an optical communication system, wherein the optical communication system includes an optical module that resides on the midplane, an optical jumper cable coupled with the optical module, and an external optical cable coupled with the optical jumper cable and the optical patch panel;
    a mezzanine card attached to the midplane, to provide connectivity between the sled and the optical patch panel, to enable transmission and reception of optical data streams, wherein the optical module is coupled with the mezzanine card; and
    a top of rack (TOR) switch coupled with the optical patch panel, wherein the optical patch panel is to provide connectivity between the tray and the TOR switch of the rack assembly.

2. The rack assembly of claim 1, wherein the mezzanine card includes a central processing unit (CPU) control module, and a switch coupled with the optical module.

3. The rack assembly of claim 1, wherein the optical patch panel comprises one or more optical channels to provide optical connections between the tray and other trays of the rack assembly, and one or more uplink optical channels, to provide optical connections of the rack assembly with other rack assemblies via the TOR switch of the rack assembly.

4. The rack assembly of claim 3, wherein the compute node comprises a central authority coupled with a plurality of compute nodes of the other rack assemblies, to receive a process system management data from the plurality of compute nodes, wherein the system management data includes power management data, humidity control data, cooling control data, workload provisioning data, storage servicing data, input-output (I/O) data, and throughput data.

5. The rack assembly of claim 1, wherein the compute node comprises a server.

6. The rack assembly of claim 1, further comprising a power connector coupled with the tray, to provide power to the tray.

7. A rack assembly, comprising:
    a tray, having at least one sled including at least one compute node, and a midplane coupled with the sled, to provide connectivity for the sled;
    an optical patch panel coupled with the midplane; and
    a top of rack (TOR) switch coupled with the optical patch panel, wherein the optical patch panel is to provide connectivity between the tray and the TOR switch of the rack assembly, and wherein the optical patch panel comprises one or more optical channels to provide optical connections between the tray and other trays of the rack assembly, and one or more uplink optical channels, to provide optical connections of the rack assembly with other rack assemblies via the TOR switch of the rack assembly.

8. The rack assembly of claim 7, wherein the TOR switch includes one or more optical modules, to provide connectivity between the tray and other trays of the rack assembly.

9. The rack assembly of claim 7, further comprising a mezzanine card attached to the midplane, to provide the connectivity for the sled of the tray, wherein the connectivity includes Ethernet connectivity and Peripheral Component Interconnect Express (PCIe) connectivity.

10. The rack assembly of claim 9, wherein the mezzanine card includes a central processing unit (CPU) control module, a switch, and one or more silicon photonic modules to provide optical connectivity between the sled and the optical patch panel, to enable transmission and reception of optical data streams.

11. The rack assembly of claim 10, wherein the switch of the mezzanine card comprises an Ethernet switch, to aggregate electrical signals, prior to transmission via the one or more silicon photonic modules.

12. The rack assembly of claim 7, wherein the one or more optical channels and uplink optical channels are disposed according to a network connectivity model, wherein the model comprises one of: an N-dimensional (N-D) ring, Clos, or a combination thereof.

13. The rack assembly of claim 7, wherein the one or more uplink optical channels comprise an optical cable, to provide optical connections with a network interface chip (NIC) of the switch of the rack assembly.

14. The rack assembly of claim 7, wherein the compute node comprises a server.

15. The rack assembly of claim 7, wherein the compute node provides a compute, storage, or networking function, or a combination thereof.

16. The rack assembly of claim 15, wherein the storage comprises one or more solid state disk drives (SSD) or hard disk drives (HDD).

17. The rack assembly of claim 7, wherein the sled with the compute node is removably attachable to the tray.

18. The rack assembly of claim 7, wherein the rack assembly comprises a data center.

* * * * *